US006252529B1

United States Patent
Bolda et al.

(10) Patent No.: US 6,252,529 B1
(45) Date of Patent: Jun. 26, 2001

(54) ADJUSTABLE GAIN PRECISION FULL WAVE RECTIFIER WITH REDUCED ERROR

(75) Inventors: Daniel J. Bolda, New Berlin; Steven T. Haensgen, Oak Creek, both of WI (US)

(73) Assignee: Rockwell Technologies, LLC, Thousand Oaks, CA (US)

( * ) Notice: Subject to any disclaimer, the term of this patent is extended or adjusted under 35 U.S.C. 154(b) by 0 days.

(21) Appl. No.: 09/407,603

(22) Filed: Sep. 28, 1999

(51) Int. Cl.[7] ................................................. H03M 1/62
(52) U.S. Cl. ......................... 341/139; 381/106; 381/107
(58) Field of Search ................................. 341/139, 126, 341/121; 381/107, 106, 108, 321; 327/104, 178, 184; 330/2; 324/119

(56) References Cited

U.S. PATENT DOCUMENTS

| 3,824,413 | * | 7/1974 | Awipi et al. | 327/5 |
| 4,320,351 | * | 3/1982 | Brown, Jr. et al. | 330/260 |
| 4,472,608 | * | 9/1984 | Beirne | 379/399 |
| 4,811,018 | * | 3/1989 | Sakata | 341/139 |
| 4,855,685 | * | 8/1989 | Hochschild | 330/282 |
| 5,684,480 | * | 11/1997 | Jansson | 341/139 |
| 5,719,326 | * | 2/1998 | Vulih et al. | 73/35.07 |
| 5,815,040 | * | 9/1998 | Barbetta | 330/264 |
| 5,822,442 | * | 10/1998 | Agnew et al. | 381/107 |
| 5,862,238 | * | 1/1999 | Agnew et al. | 381/321 |

* cited by examiner

Primary Examiner—Peguy JeanPierre
Assistant Examiner—Jean Bruner Jeanglaude
(74) Attorney, Agent, or Firm—Patrick S. Yoder; John J. Horn; A. M. Gerasimow

(57) ABSTRACT

A circuit is provided for rectifying and amplifying an AC input waveform to optimize the dynamic range of downstream circuitry, such as an analog-to-digital converter. The circuitry includes an inverting amplifier and a non-inverting amplifier. The inverting amplifier includes a selectable resistance network in a feedback loop that permits the gain to be adjusted by appropriate selection of conductive states of solid state switches. The non-inverting amplifier includes a selectable resistance network on an input line. A control circuit, such as a microprocessor, monitors the output of the A/D converter and controls the conductive state of switches in the feedback and input networks to maintain the digital output within a desired portion of the dynamic range of the A/D converter. Several discrete gains may be provided and programmed in accordance with a predetermined selection scheme.

31 Claims, 2 Drawing Sheets

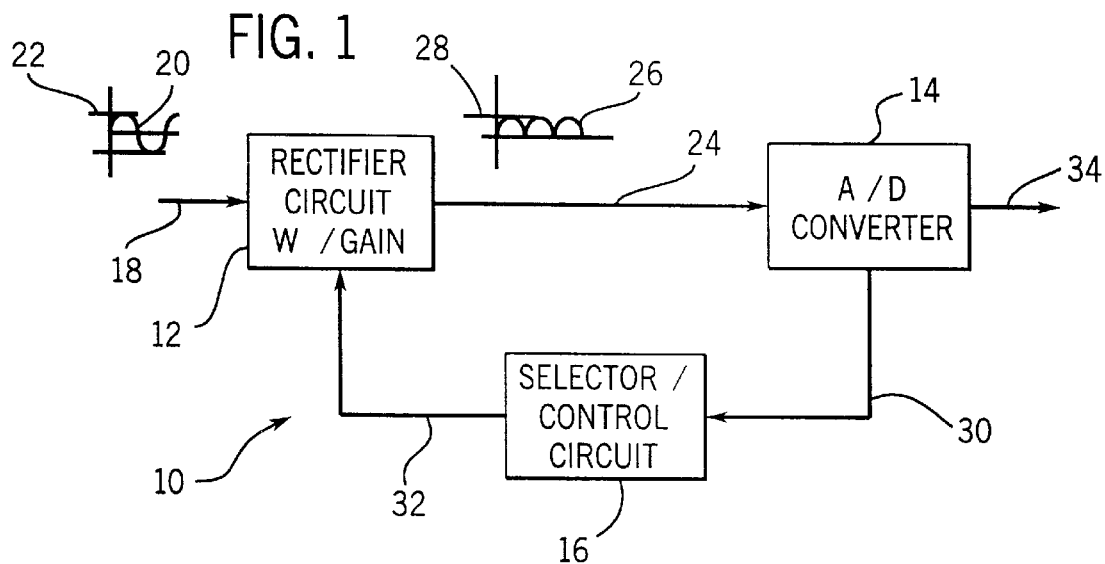
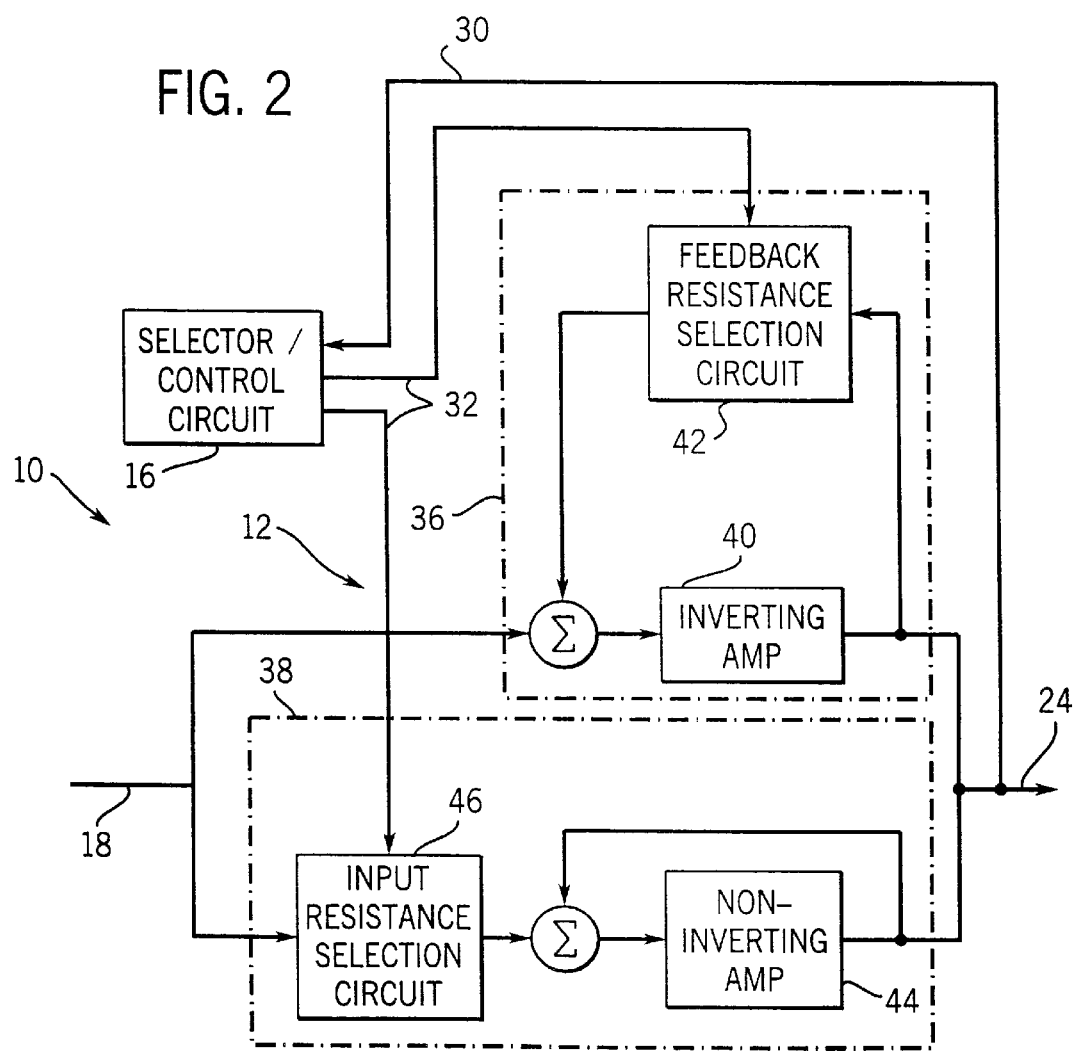

ADJUSTABLE GAIN PRECISION FULL WAVE RECTIFIER WITH REDUCED ERROR

BACKGROUND OF THE INVENTION

1. Field of the Invention

The present invention relates generally to circuitry for conditioning alternating current waveforms to produce amplified and rectified waveforms. In particular, the invention relates to a technique for receiving AC waveforms of a fairly large dynamic range, rectifying the waveform, and amplifying the waveform by one of a plurality of discrete gain levels in a closed loop feedback configuration for obtaining waveforms suitable for input into downstream circuitry, such as an analog-to-digital converter.

2. Description of the Related Art

A variety of applications exist for signal processing of alternating current waveforms wherein the input waveform must be rectified and amplified for application to downstream circuitry. For example, in a current sensing relay, current sensors may be applied to one or more current-carrying conductors for outputting signals which are indicative of a level of current flow. Depending upon the type of downstream processing, the signal may need to be rectified and digitized, particularly where downstream circuitry includes digital signal processing circuitry such as microprocessors, digital signal processors, and the like. In such arrangements, circuitry must not only rectify the input signal, but may need to amplify the input signal to make best use of the dynamic range of an analog-to-digital converter. The amplification becomes somewhat more complex in applications where the dynamic range of the input signal itself may vary widely.

In applications including analog-to-digital converters and input signals comprising AC waveforms of a broad dynamic range, difficulties may be encountered in the scaling of the rectified waveform to make best use of the dynamic range of the analog-to-digital converter, while avoiding excessive amplification of noise. For example, where an input signal to such circuitry is an AC waveformn, a very low amplitude may result in output data from the analog-to-digital converter which is of little utility due to a lack of sufficient amplification. On the contrary, where an input signal has a dynamic range which may change substantially during operation, a fixed amplification level may cause the analog-to-digital converter output to saturate when the amplitude of the input signal increases substantially as compared to its normal amplitude levels, or at least to the amplitude levels at which the amplification gain was appropriate.

In monitoring and control equipment, such as microprocessor-based overload relays, very substantial dynamic ranges may be encountered in input levels of AC waveforms, such as from current sensors. To perform analysis of the input signals, however, the signals must be rectified and digitized. Accommodation of the large variations in the amplitude of the input signal requires a novel approach to both the rectification and the amplification of the signal prior to application of the output to the analog-to-digital converter.

In general, analog-to-digital converters may not sample negative portions of an input signal, such devices generally operating between an input range of 0 to 5 volts. Thus, precision full wave rectifiers are typically needed to provide an absolute value function, affording proper operation of the analog-to-digital converter. Traditional full wave rectifiers have been employed for this purpose, including a pair of cascaded amplifiers to produce the absolute value function. However, such devices often produce intolerable levels of error due to the amplification of the first stage amplifiers error by the second amplifier, and addition of this amplified error to the error of the second amplifier itself. Moreover, conventional precision full wave rectifiers may offer gain, but do not offer adjustable gain. Such adjustability in gain levels would be highly desirable to increase the dynamic range of the system, but such adjustability is difficult to synthesize in a non-cascaded amplifier approach.

There is a need, therefore, for a technique capable of rectifying and amplifying AC waveforms of varying amplitude. For practical applications, the technique should be relatively easy to implement and cost effective to manufacture. Moreover, there is a particular need for a technique which provides discrete levels of amplification based upon the level of an output waveform applied to downstream circuitry, such as an analog-to-digital converter. In circuits including a digital signal processor, a microprocessor or a similar programmable device, it would be particularly convenient to provide some degree of feedback control of the amplification level based upon detected and fed-back characteristics of the output waveform.

SUMMARY OF THE INVENTION

The present invention provides a technique for rectifying and amplifying an input waveform designed to respond to these needs. The technique may be implemented in a variety of devices, but is particularly well suited to devices in which an input waveform has a substantial dynamic range, requires rectification, and must be amplified to optimize a dynamic range of downstream circuitry. The technique makes use of inverting and noninverting amplifier circuits, such that rectification is performed by inverting negative polarity lobes of an input waveform, while passing positive polarity lobes without inversion. Amplification is performed by both the inverting and the non-inverting circuits. The gain of each of the amplifying circuits may be selected among a plurality of discrete gains as defined by a switchable resistance circuit associated with each amplifier. In a preferred configuration, solid state switches are employed for selecting the appropriate gain level.

Where a microprocessor or other programmable digital signal processing circuitry is employed in the device, the discrete gain may be selected by detecting the amplitude of the waveform, or of a digitized signal downstream of the amplifiers. The output signal amplitude, or the output of an analog-to-digital converter receiving the rectified and amplified signal is fed back to the microprocessor, which then generates command signals for placing the selector switches in conductive states appropriate for selecting the desired gain. Various schemes may be employed for selecting the appropriate gain. In a presently preferred configuration, for example, the circuitry may assume and lowest gain level, monitor output, and increase gain until the output reaches a level that does not saturate the downstream circuitry, particularly an analog-to-digital converter. The input signal is thus rectified, and amplified to make optimal use of the dynamic range of the downstream circuitry.

BRIEF DESCRIPTION OF THE DRAWINGS

The foregoing and other advantages of the invention will become apparent upon reading the following detailed description and upon reference to the drawings in which:

FIG. 1 is a diagrammatical representation of a feedback loop for selecting and controlling gains in a rectifying and amplifying circuit in accordance with certain aspects of the present technique;

FIG. 2 is a diagrammatical representation of certain of the functional circuits comprising the rectification and amplification circuits of the arrangement of FIG. 1, as well as selector and control circuitry for selecting among discrete gain levels.

DETAILED DESCRIPTION OF SPECIFIC EMBODIMENTS

Figure 3:
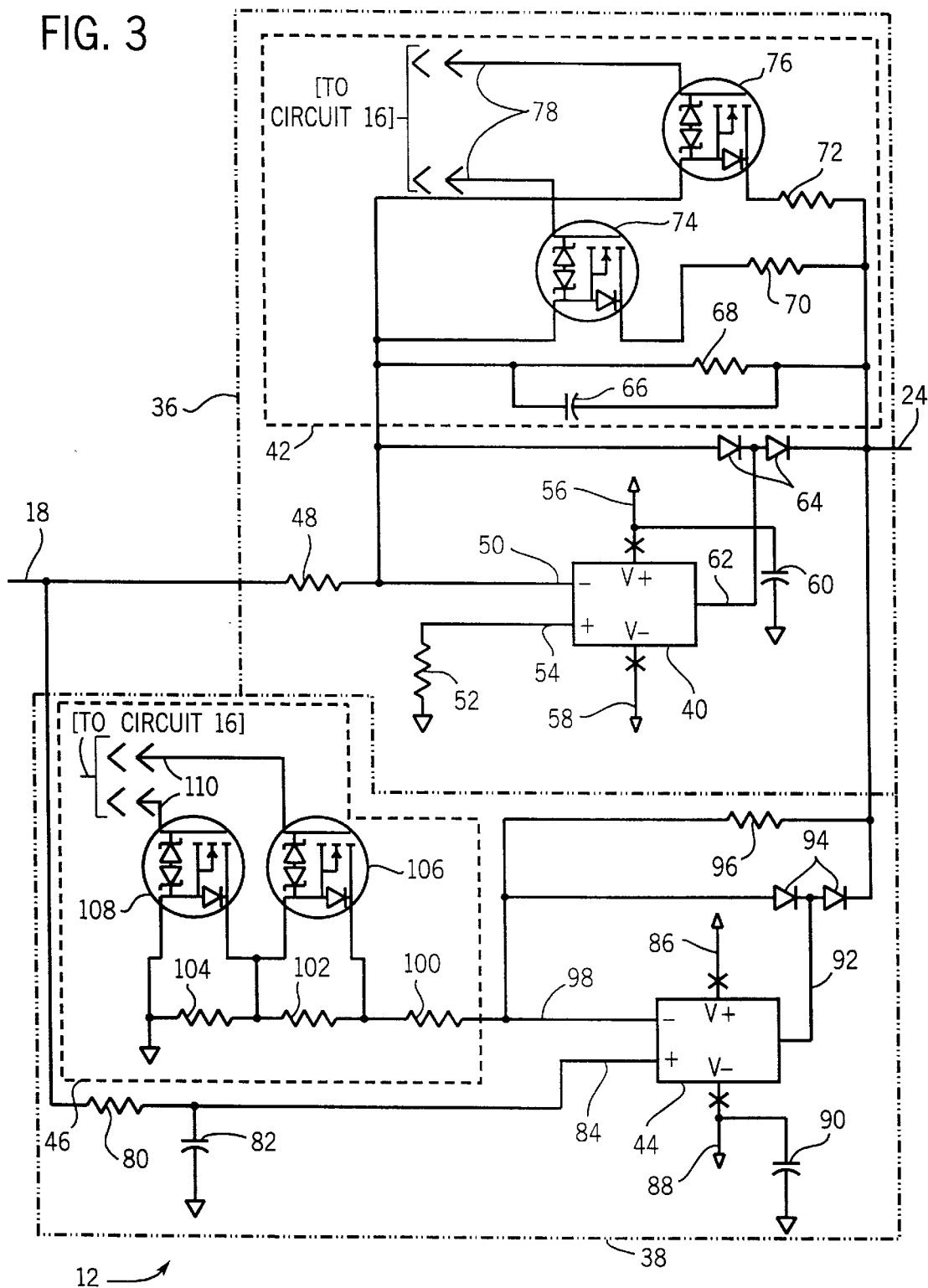
FIG. 3 is a schematic representation of a presently preferred circuit for carrying out the rectification and selective amplification functions implemented via the functional circuitry of FIG. 2.

Turning now to the drawings, and referring first to FIG. 1, a signal conversion circuit, designated generally by the reference numeral 10, is illustrated for converting an AC waveform as an input signal to a rectified and amplified output waveform. Signal conversion circuit 10 includes a rectifier circuit with gain 12, an analog-to-digital (A/D) converter circuit 14, and a selector/control circuit 16. The rectifier circuit 12 receives an input as indicated at reference numeral 18. The input waveform, shown graphically at reference numeral 20, may generally be an AC waveform, such as a waveform produced by a sensor. In a present embodiment, the input waveform is produced by a current sensor associated with an AC conductor (not shown). However, other waveform sources and types may be applied to circuitry 10. The input waveform 20 has an amplitude 22 which may vary substantially during operation. By way of example, in a present application, an input waveform may vary in amplitude from a level of approximately 10 mv to approximately 2.5v. Circuit 12, which includes components for selectively applying one of a plurality of discrete gains, rectifies the input signal, and amplifies the input signal to produce an output waveform along an output 24.

The output waveform, designated generally by reference numeral 26 in FIG. 1, is rectified and preferably amplified to obtain an amplitude which optimizes the dynamic range of downstream circuitry, such as A/D converter 14. In a presently contemplated application, the A/D converter 14 may receive signals of levels of between 0 and 5v, but optimally receives input signals along line 24 resulting in output counts from the A/D converter of desired levels (e.g. 65 to 235 counts of a 255 count range), corresponding to input voltages of similar levels (e.g. approximately 1 volt and 4.5 volts). As will be appreciated by those skilled in the art, the actual A/D count output will generally vary with both the input voltage and current to the A/D converter. Switching of the discrete gains, as described below, may actually be performed at various range levels or average levels, and the particular switching levels may differ depending upon whether gain is being increased or decreased, to provide stabilizing hysteresis in switching between gain levels.

To accommodate the dynamic range needed by A/D converter 14, circuitry 10 selectively applies gain levels in rectifier circuit 12 under the control of selector/control circuit 16. Selector/control circuit 16, to implement this selection function, receives feedback of the output via a feedback line 30. Feedback to the selector/control circuit 16 may be in the form of a rectified, amplified waveform, but in the illustrated embodiment, is actual output from the A/D converter 14. In particular, where a digital circuit, such as a microprocessor is employed with appropriate code for carrying out the selection and control functions of circuit 16, a digitized signal may be conveniently applied to the circuit for analysis of the appropriate amplification level and control as described below. Based upon the level of the feedback signal, circuit 16 produces command or control signals and applies them to circuit 12 as indicated at line 32. Finally, based upon the appropriate amplification level, A/D converter 14 produces a digital output signal as indicated at reference numeral 34, which is applied to downstream circuitry for the desired signal analysis, control, and other functions.

FIG. 2 illustrates functional circuitry components of the signal conversion circuitry 10 in somewhat greater detail, particularly of the rectifier circuit with gain 12. As shown in FIG. 2, circuit 12 receives input via input line 18, and routes the input to a pair of amplifier circuits 36 and 38. Circuit 36 is an inverting amplifier circuit with selectable gain. Circuit 36 converts negative polarity lobes of the input signal to positive polarity lobes, and applies a selectable gain to the rectified signal portions for output along output line 24. Circuit 38, conversely, is a non-inverting amplifier with selectable gain. Circuit 38 thus passes positive polarity lobes of the input waveform, applying a selected gain to the positive lobes, also for output along output line 24. The output line thus carries rectified and amplified output waveforms comprising combinations of the output of circuits 36 and 38. Feedback to the selector/control circuit 16 is provided via feedback line 30, which as indicated above, may be based upon digital output from a downstream A/D converter.

Circuits 36 and 38 include amplifiers and resistance selection circuitry for applying one of a plurality of discrete gain levels to the input waveform. In particular, inverting amplifier circuit 36 includes an inverting amplifier 40 with a feedback resistance selection circuit 42. Because the input resistance to inverting amplifier 40 is known and constant, gain of the inverting amplifier may be controlled by appropriately selecting the resistance of feedback resistance selection circuit 42, and summing the feedback and input signals as indicated in FIG. 2. Similarly, non-inverting amplifier circuit 38 includes a non-inverting amplifier 44. However, because amplifier 44 is non-inverting, control of the gain of the amplifier is selected via an input resistance selection circuit 46, with a constant and known feedback resistance being provided. As will be appreciated by those skilled in the art, the effective gains of amplifier circuits 36 and 38 are established by relationships between the feedback and input resistances. Variations on the circuitry illustrated in FIG. 2, and discussed in greater detail below with reference to FIG. 3, may be envisioned, in which some or all of the adjustment in gain is made via regulation of both feedback and input resistance levels on both the inverting and non-inverting amplifiers. However, the preferred embodiment illustrated benefits from a reduced number of components and a straightforward implementation.

FIG. 3 illustrates the inverting and non-inverting amplifier circuits with selectable discrete gains in somewhat greater detail. In particular, rectifier circuit with gain 12 includes the inverting amplifier 36 and the non-inverting amplifier 38 comprised of operational amplifiers, including an inverting amplifier 40, and a non-inverting amplifier 44. An input resistance 48 is coupled to an input line 50 to inverting amplifier 40 to provide the desired input resistance for gain control. In a present embodiment, resistance 48 has a value of 4.99 kohms. A compensation resistor 52, such as a 4.87 kohm resistor is coupled between input 54 of inverting amplifier 40 and an analog ground potential, defining a low impedance connection to ground. Amplifier 40 is further coupled to power supply sources 56 and 58, such as a positive and negative 12 volt bus. The power supply line 56 may be further connected to an analog ground potential through a decoupling capacitor 60. In the illustrated embodiment, because a dual operational amplifier package is employed, a single pair of capacitors 60 (and 90 described below) are used. Other component packaging may require additional decoupling capacitors. Where desired, a tuned resistance may be provided in place of resistor 52 to reduce voltage errors at output line 24.

Output 62 of inverting amplifier 40 is coupled to a diode pair 64 on output line 24 to maintain the amplifier in an off state when non-inverting amplification circuit 38 is functional in applying an output signal. The diode pair thus includes one diode operational as a shunt between the amplifier's inverting terminal and its output, and a blocking diode between the amplifier's output and outline line 24. The output of inverting amplifier 40 is further coupled to feedback resistance selection circuit 42 which serves to place a desired resistance value along the feedback line of the amplifier to control the amplifier gain. Circuit 42 includes a low pass noise filtering capacitor 66 in parallel with a first feedback resistor 68. In parallel with resistor 68, at least one additional selectable resistance is provided, two such resistances being provided in the illustrated embodiment and designated by reference numerals 70 and 72. Resistances 70 and 72 may be selectively coupled in parallel with resistance 68 via a solid state switches 74 and 76, such as n-channel MOSFETs. While any desired resistances may be provided in the feedback portion of the circuitry, in a presently preferred configuration, resistor 68 has a value of 165k ohm, resistor 70 has a value of 18.2 kohm, and resistor 72 has a value of 110 kohm. The solid state switches 74 and 76 are placed in a normally non-conducting state, and may be switched to a conducting state, thereby placing resistances 70 and 72 in parallel with resistance 68 (and with one another) by application of a control signal to gate input lines 78 of each switch. Such command signals are provided by circuit 16 discussed above, which will preferably include a microprocessor or similar digital, configurable circuitry.

Input via input line 18 is transmitted to non-inverting amplification circuit 38 through a compensation resistor 80 and a noise filtering capacitor 82 coupled to an analog ground potential. The input is then applied to non-inverting amplifier 44 as indicated at reference numeral 84. In a present embodiment, compensating resistor 80 has a value of 3.01 kohms, while capacitor 82 has a rating of 0.018 microF. Non-inverting amplifier 44 is coupled to a power source via inputs 86 and 88, such as positive and negative 12 volt bus lines. A decoupling capacitor 90 is coupled to negative power input 88 and to an analog ground potential.

An output line 92 of non-inverting amplifier 44 is coupled to a diode pair 94 which insures that non-inverting amplification circuit 38 is off when a signal is being provided by inverting amplification circuit 36 along output line 24. Thus, like diode pair 64, diode pair 94 includes one diode operational as a shunt between the amplifier's inverting terminal and its output, and a blocking diode between the amplifier's output and out line 24. In parallel with the diode pair, a feedback resistor 96 is provided which establishes the feedback resistance level used to set the gain of circuit 38 in combination with the selections made in input resistance selection circuit 46. In a present embodiment, resistor 96 has a value of 95.3 kohms. Diode pair 94 and resistor 96 are then coupled to a negative input 98 of non-inverting amplifier 44.

Input resistance selection circuit 46 is coupled to negative input 98 of amplifier 44 and serves to selectively place one or more resistors in series between input 98 and an analog ground potential. In particular, in the illustrated embodiment, circuit 46 includes a first resistor 100 which is resident in the input line, as well as additional resistors 102 and 104 which may be selectively coupled in series with resistor 100 by opening solid state switching devices 106 and 108, respectively. In a present embodiment, resistor 100 has a rating of 3.01 kohms, resistor 102 has a rating of 38.3 kohms, and resistor 104 has a rating of 4.75 kohms. Switching devices 106 and 108 serve as gain selector switches, and are preferably n-channel MOSFETs. Inputs to the switching devices 106 and 108 are provided via gate input lines 110, coupled to selector/control circuit 16. Thus, circuit 16 may close switches 106 and 108 to create a parallel current-conducting path around each input resistor 102 and 104, or may open the switching devices to interrupt the parallel path and thus force all current flow through the resistors in series with input resistor 100.

As will be appreciated by those skilled in the art, the foregoing circuitry allows for inversion of the input waveform applied to input line 18. In particular, positive polarity portions of the waveform are transferred through circuit 38, with the positive portions of the waveform being amplified by the gain defined by the relationship:

$$G_{non\text{-}inverting} = (1 + R_{fb}/R_{input}) \qquad (eg.1);$$

where G is the effective gain of the circuit, $R_{fb}$ is the feedback resistance defined by resistor 96, and $R_{input}$ is the effective resistance defined by the network of circuit 46. Similarly, negative polarity portions of the input waveform are inverted by amplifier 40, with the corresponding input waveform portions being amplified in accordance with the relationship:

$$G_{inverting} = R_{fb}/R_{input} \qquad (eq.2);$$

where G is the gain of circuit 36, $R_{fb}$ is the effective resistance of the network of circuit 42, and $R_{input}$ is the input resistance defined by resistor 48.

As mentioned above, various approaches may be employed with circuit 12 to command the discrete gain levels defined by the input and feedback resistance networks. In a presently preferred embodiment, output of the A/D converter 14 is monitored by the selector/control circuit 16 and gain is first selected at a lowest level. If the output of the A/D converter is within a low region of the dynamic range of that device, circuit 16 commands switching devices 74, 76, 106 and 108 to increase the gain until the dynamic range is properly utilized. During operation, the output of the circuitry may be continuously monitored to adjust the gain to one of the discrete levels as desired. In the foregoing device, three such discrete gain levels are provided, of approximately 2, 10 and 30. However, more or fewer discrete gain levels may be programmned, and these may be obtained through switching of solid state devices similar to the technique described above.

While the invention may be susceptible to various modifications and alternative forms, specific embodiments have been shown and described herein by way of example only. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A signal conditioning circuit for rectifying and amplifying an input signal, the circuit comprising:

an inverting circuit including an inverting amplifier, an input resistance and a feedback resistance circuit, the feedback resistance circuit including a plurality of first resistances selectively combinable to provide a plurality of gain levels, the inverting circuit inverting first portions of the input signal and amplifying the inverted first portions based upon a first selected gain level; and a non-inverting circuit including a non-inverting amplifier, a feedback resistance and an input resistance circuit, the input resistance circuit including a plurality of second resistances selectively combinable to provide a plurality of gain levels, the non-inverting circuit passing second portions of the input signals and amplifying the second portions based upon a second selected gain level.

2. The circuit of claim 1, further comprising a plurality of solid state switching devices in the feedback resistance circuit and the input resistance circuit, and wherein the resistances of the feedback resistance circuit and the input resistance circuit are selectively combinable by changing conductive states of the switching devices.

3. The circuit of claim 2, further comprising a control circuit coupled to the solid state switching devices, the control circuit applying control signals to the switching devices to place the switching devices in desired conductive states for combination of the resistances of the feedback and input resistance circuits.

4. The circuit of claim 3, wherein the control circuit monitors an output signal derived from signals amplified by the inverting circuit and the non-inverting circuit, and generates the control signals based upon the output signal.

5. The circuit of claim 4, further comprising an analog-to-digital converter coupled to outputs of the inverting and non-inverting circuits for generating a digital signal based upon the outputs.

6. The circuit of claim 5, wherein the control circuit monitors the digital signal and applies the control signals to the switching devices to maintain the digital signal within a desired range.

7. The circuit of claim 1, wherein the input resistance of the inverting circuit is a fixed resistance.

8. The circuit of claim 1, wherein the feedback resistance of the non-inverting circuit is a fixed resistance.

9. The circuit of claim 1, wherein the feedback resistance circuit is configured to selectively place the plurality of first resistances in parallel with one another, and the input resistance circuit is configured to selectively place the plurality of second resistances in series with one another.

10. A signal conversion circuit for converting an alternating current input waveform to a desired signal, the circuit comprising:

an inverting amplifier configured to receive the input waveform and to rectify and amplify portions of the input waveform by a first gain, the inverting amplifier having an input resistance and a feedback resistance network, the feedback resistance network including a plurality of first resistances and first solid state switches, conductive states of the switches being selectable to place the first resistances in parallel with one another and thereby to select the first gain;

a non-inverting amplifier configured to receive the input waveform and to pass and amplify portions of the input waveform by a second gain, the non-inverting amplifier having a feedback resistance and an input resistance network, the input resistance network including a plurality of second resistances and second solid state switches, conductive states of the switches being selectable to place the second resistances in series with one another and thereby to select the second gain;

a control circuit coupled to the first and second solid state switches, the control circuit applying control signals to the solid state switches to select their conductive states and thereby to select the first and second gains.

11. The circuit of claim 10, wherein the inverting and non-inverting amplifiers are each configured to produce at least three discrete gain levels by selection of the conductive states of the first and second solid state switches.

12. The circuit of claim 10, further comprising an analog-to-digital converter receiving output from the inverting and non-inverting amplifiers.

13. The circuit of claim 12, wherein the control circuit is coupled to the analog-to-digital converter, monitors digital signals produced by the converter and applies the control signals to the solid state switches based upon the digital signals.

14. The circuit of claim 13, wherein the control circuit controls the conductive states of the solid state switches to maintain the digital signals within a desired range.

15. The circuit of claim 10, wherein the input resistance of the inverting amplifier is a fixed resistance.

16. The circuit of claim 10, wherein the feedback resistance of the non-inverting amplifier is a fixed resistance.

17. A signal conversion circuit for converting an alternating current waveform to a digital value, the circuit comprising:

an inverting amplifier configured to receive the input waveform and to rectify and amplify portions of the input waveform by a first gain, the inverting amplifier having an input resistance and a feedback resistance network, the feedback resistance network including a plurality of first resistances and first solid state switches, conductive states of the switches being selectable to place the first resistances in parallel with one another and thereby to select the first gain;

a non-inverting amplifier configured to receive the input waveform and to pass and amplify portions of the input waveform by a second gain, the non-inverting amplifier having a feedback resistance and an input resistance network, the input resistance network including a plurality of second resistances and second solid state switches, conductive states of the switches being selectable to place the second resistances in series with one another and thereby to select the second gain;

an analog-to-digital converter coupled to the inverting and non-inverting amplifiers for converting output from the amplifiers to a digital value; and a control circuit coupled to the analog-to-digital converter and to the first and second solid state switches, the control circuit applying control signals to the solid state switches to select their conductive states and thereby to select the first and second gains to maintain the digital value within a desired range.

18. The circuit of claim 17, wherein the inverting and non-inverting amplifiers are each configured to produce at least three discrete gain levels by selection of the conductive states of the first and second solid state switches.

19. The circuit of claim 17, wherein the input resistance of the inverting amplifier is a fixed resistance.

20. The circuit of claim 17, wherein the feedback resistance of the non-inverting amplifier is a fixed resistance.

21. A signal conditioning circuit for rectifying and amplifying an input signal, the circuit comprising:

an inverting circuit including an inverting amplifier, an input resistance, a feedback resistance circuit, and first and second diodes coupled to an output line, the input resistance and the feedback resistance circuit resistances defining a desired inverting circuit gain, the first diode being coupled in a feedback loop around the inverting amplifier and the second diode being coupled between an output of the inverting amplifier and a common signal output; and a non-inverting circuit including a non-inverting amplifier, a feedback resistance, an input resistance circuit, and third and fourth diodes, the feedback resistance and the input resistance circuit defining a desired non-inverting circuit gain, the third diode being coupled in a feedback loop around the inverting amplifier and the fourth diode being coupled between an output of the inverting amplifier and the common signal output;

wherein negative polarity portions of an input waveform are inverted by the inverting circuit, amplified by the inverting circuit gain and applied to the common signal output when no signal is output by the non-inverting circuit, and positive polarity portions of the input waveform are amplified by the non-inverting circuit gain and applied to the common signal output when no signal is output by the inverting circuit.

22. The circuit of claim 21, wherein the feedback resistance circuit of the inverting circuit includes a plurality of first resistances selectively combinable to provide a plurality of inverting gains, and wherein the input resistance circuit of the non-inverting circuit includes a plurality of second resistances selectively combinable to provide a plurality of non-inverting gains.

23. The circuit of claim 22, further comprising a plurality of solid state switching devices in the feedback resistance circuit and the input resistance circuit, and wherein the resistances of the feedback resistance circuit and the input resistance circuit are selectively combinable by changing conductive states of the switching devices.

24. The circuit of claim 23, further comprising a control circuit coupled to the solid state switching devices, the control circuit applying control signals to the switching devices to place the switching devices in desired conductive states for combination of the resistances of the feedback and input resistance circuits.

25. The circuit of claim 24, wherein the control circuit monitors an output signal derived from signals output on the common output, and generates the control signals based upon the output signal.

26. The circuit of claim 25, further comprising an analog-to-digital converter coupled to the common output for generating a digital signal based upon the output signals from the inverting and non-inverting circuits.

27. A method for rectifying and amplifying an alternating current waveform of variable amplitude, the method comprising the steps of:

applying the waveform to an inverting amplifier having a plurality of discrete gain levels defined by a plurality of first resistances selectively connectable in a feedback network to rectify and amplify negative portions of the waveform by a desired one of the discrete gain levels;

applying the waveform to a non-inverting amplifier having a plurality of discrete gain levels defined by a plurality of second resistances selectively connectable in an input network to amplify positive portions of the waveform by a desired one of the second discrete gain levels;

combining output of the inverting and non-inverting amplifiers to obtain an output waveform; and monitoring a signal derived from the output waveform and selecting the first and second discrete gain levels based upon the signal.

28. The method of claim 27, wherein the first resistances are selectively connectable within the feedback network via solid state switches, and wherein the step of selecting the gain levels includes placing the solid state switches in desired conductive states to place the resistances electrically in parallel with one another.

29. The method of claim 27, wherein the second resistances are selectively connectable within the input network via solid state switches, and wherein the step of selecting the gain levels includes placing the solid state switches in desired conductive states to place the resistances electrically in series with one another.

30. The method of claim 27, wherein the signal monitored is a digital signal produced by an analog-to-digital converter based upon the output waveform.

31. The method of claim 30, wherein the first and second gain levels are selected to maintain the digital signal within a desired range.

* * * * *